(12) United States Patent
Wada

(10) Patent No.: US 7,879,633 B2
(45) Date of Patent: *Feb. 1, 2011

(54) MINIATURE OPTICAL ELEMENT FOR WIRELESS BONDING IN AN ELECTRONIC INSTRUMENT

(75) Inventor: Kenji Wada, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/453,301

(22) Filed: May 6, 2009

(65) Prior Publication Data

US 2009/0221108 A1    Sep. 3, 2009

Related U.S. Application Data

(60) Division of application No. 11/896,708, filed on Sep. 5, 2007, now Pat. No. 7,544,973, which is a continuation of application No. 11/437,805, filed on May 22, 2006, now Pat. No. 7,276,738, which is a continuation of application No. 10/759,266, filed on Jan. 20, 2004, now Pat. No. 7,074,632, which is a division of application No. 09/901,037, filed on Jul. 10, 2001, now Pat. No. 6,703,689.

(30) Foreign Application Priority Data

Jul. 11, 2000   (JP)   ............... 2000-209352
May 31, 2001   (JP)   ............... 2001-165017

(51) Int. Cl.
   *H01L 21/00*   (2006.01)
(52) U.S. Cl. ........... 438/29; 257/E21.211; 257/E33.067
(58) Field of Classification Search ............... 438/29; 257/E21.211, E33.067
   See application file for complete search history.

(56) References Cited

U.S. PATENT DOCUMENTS

| | | |
|---|---|---|
| 3,903,427 A | 9/1975 | Pack |
| 4,348,253 A | 9/1982 | Subbarao et al. |
| 4,377,316 A | 3/1983 | Ecker et al. |
| 4,696,885 A | 9/1987 | Vijan |
| 5,108,562 A | 4/1992 | Duke et al. |
| 5,162,258 A | 11/1992 | Lemnios et al. |
| 5,438,216 A | 8/1995 | Juskey et al. |
| 5,786,589 A | 7/1998 | Segawa et al. |
| 5,808,873 A | 9/1998 | Celaya et al. |
| 5,841,190 A | 11/1998 | Noda et al. |
| 5,888,884 A | 3/1999 | Wojnarowski |
| 6,114,768 A | 9/2000 | Gaul et al. |
| 6,171,883 B1 | 1/2001 | Fan et al. |

(Continued)

FOREIGN PATENT DOCUMENTS

CN   1244949 A   2/2000

(Continued)

*Primary Examiner*—David S Blum
(74) *Attorney, Agent, or Firm*—Oliff & Berridge, PLC

(57) ABSTRACT

A method of manufacturing an optical element including the steps of: forming a through hole in a semiconductor element which has an optical section and an electrode electrically connected to the optical section; and forming a conductive layer extending from a first surface of the semiconductor element on which the optical section is formed, through an inner wall surface of the through hole, to a second surface opposite to the first surface.

26 Claims, 13 Drawing Sheets

U.S. PATENT DOCUMENTS

| | | |
|---|---|---|
| 6,175,141 B1 | 1/2001 | Hofbauer et al. |
| 6,184,056 B1 | 2/2001 | Nakamura et al. |
| 6,225,651 B1 | 5/2001 | Billon |
| 6,251,696 B1 | 6/2001 | Ikeya et al. |
| 6,323,546 B2 | 11/2001 | Hsuan et al. |
| 6,383,835 B1 | 5/2002 | Hata et al. |
| 6,383,837 B1 | 5/2002 | Tsunashima |
| 6,392,158 B1 | 5/2002 | Caplet et al. |
| 6,404,061 B1 | 6/2002 | Hikita et al. |
| 6,424,048 B1 | 7/2002 | Umetsu et al. |
| 6,677,237 B2 | 1/2004 | Umetsu et al. |
| 6,703,689 B2 | 3/2004 | Wada |
| 6,720,661 B2 | 4/2004 | Hanaoka et al. |
| 6,911,392 B2 | 6/2005 | Bieck et al. |
| 2002/0096760 A1 | 7/2002 | Simelgor et al. |
| 2003/0022475 A1 | 1/2003 | Vieux-Rochaz et al. |

FOREIGN PATENT DOCUMENTS

| | | |
|---|---|---|
| JP | A-53-026689 | 3/1978 |
| JP | U-56-021468 | 2/1981 |
| JP | A-58-170052 | 10/1983 |
| JP | A-59-222954 | 12/1984 |
| JP | A-61-128564 | 6/1986 |
| JP | A-62-243370 | 10/1987 |
| JP | A-63-62267 | 3/1988 |
| JP | A-63-126250 | 5/1988 |
| JP | U-64-000347 | 1/1989 |
| JP | A-05-029537 | 2/1993 |
| JP | A-05-251455 | 9/1993 |
| JP | A-06-112454 | 4/1994 |
| JP | A-08-124930 | 5/1996 |
| JP | A-08-330313 | 12/1996 |
| JP | A-09-506712 | 6/1997 |
| JP | A-10-10374 | 1/1998 |
| JP | A-11-087526 | 3/1999 |
| JP | A-11-330526 | 11/1999 |
| JP | 2000-196014 A | 7/2000 |
| JP | A-2000-261007 | 9/2000 |
| WO | WO 95/17014 | 6/1995 |
| WO | WO 00/36650 | 6/2000 |

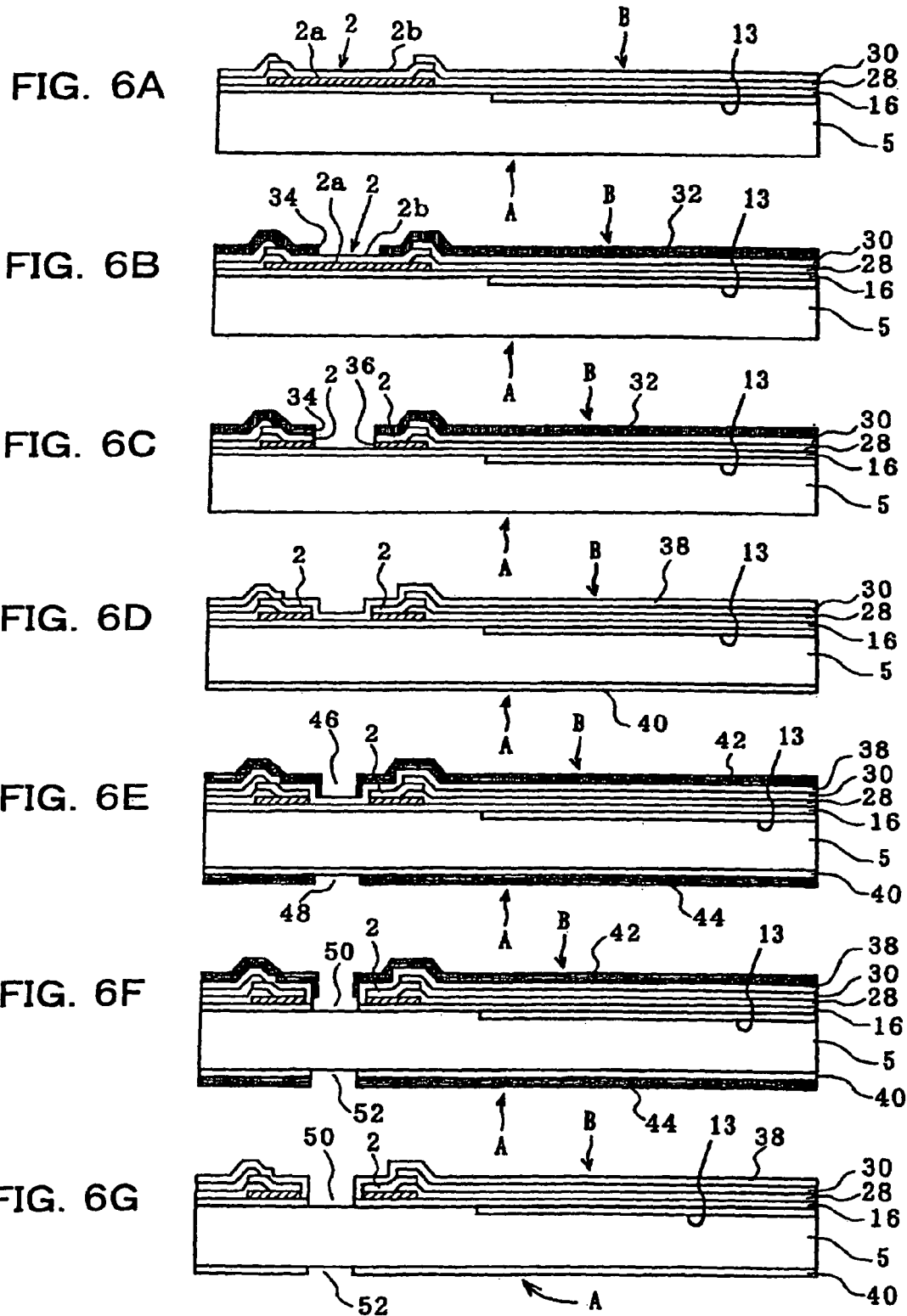

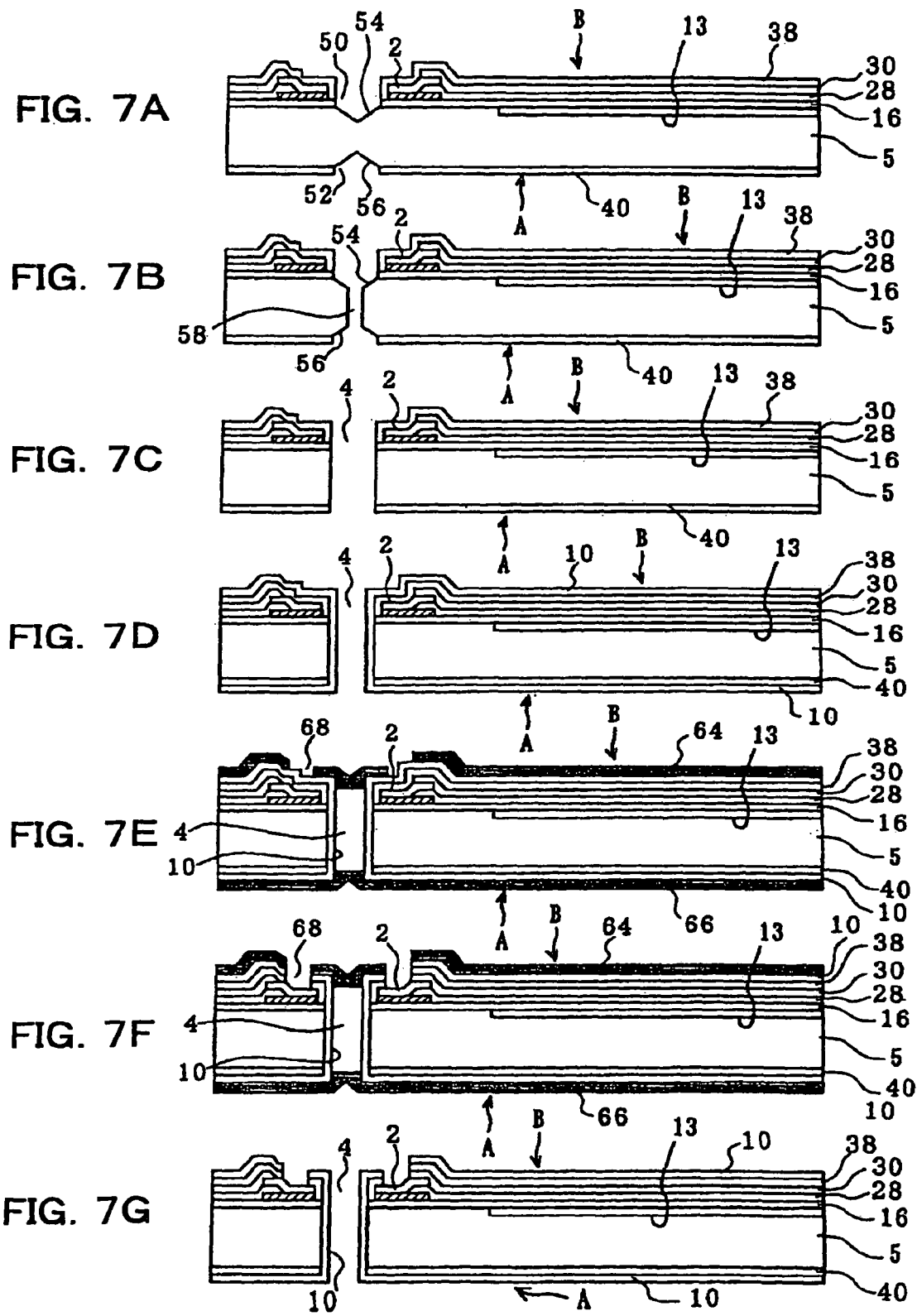

MINIATURE OPTICAL ELEMENT FOR WIRELESS BONDING IN AN ELECTRONIC INSTRUMENT

This is a Division of application Ser. No. 11/896,708 filed Sep. 5, 2007, now U.S. Pat. No. 7,544,973, which is a Continuation of application Ser. No. 11/437,805 filed May 22, 2006, now U.S. Pat. No. 7,276,738, which is a Continuation of application Ser. No. 10/759,266 filed Jan. 20, 2004, now U.S. Pat. No. 7,074,632 which is a Division of application Ser. No. 09/901,037 filed Jul. 10, 2001, now U.S. Pat. No. 6,703,689. The entire disclosure of the prior application is hereby incorporated by reference herein in its entirety.

Japanese Patent Application 2000-209352, filed Jul. 11, 2000, and Japanese Patent Application 2001-165017, filed May 31, 2001 are hereby incorporated by reference in their entirety.

TECHNICAL FIELD

The present invention relates to an optical element and method of manufacturing the optical element, and to an electronic instrument.

BACKGROUND

FIG. 16 is an enlarged sectional view of a conventional optical element package.

This conventional optical element package 200 includes a ceramic package 204 in which leads 202 are brazed to laminated ceramics. An optical element 208 is fixed on a mounting portion 206 of the ceramic package 204 by a die bond material 210. Electrodes 212 of the optical element 208 and electrodes 214 of the ceramic package 204 are electrically connected by wire bonding. Over the optical element 208, a lid material (optical glass) 218 is disposed. The lid material 218 is fixed to a step 216 at the recessed edge of the ceramic package 204 by low melting point glass 220, and seals the cavity of the ceramic package 204.

Thus conventionally the optical element 208 is laminated on the ceramic package 204, and the electrodes are wire bonded together, for which reason the area of the optical element package 200 is inevitably larger than the optically active area after packaging, resulting in a limit to the increase of mounting density.

The ceramic package 204 has a high cost of materials, and also since the manufacturing procedure is complicated, the costs are further increased.

SUMMARY

A method of manufacturing an optical element according to the present invention comprises the steps of:

forming a through hole in a semiconductor element which has an optical section and an electrode electrically connected to the optical section; and forming a conductive layer extending from a first surface of the semiconductor element on which the optical section is formed, through an inner wall surface of the through hole, to a second surface opposite to the first surface.

An optical element according to the present invention comprises a semiconductor chip which has an optical section and an electrode electrically connected to the optical section, wherein the semiconductor chip includes a through hole, and a conductive layer extending from a first surface of the semiconductor ship on which the optical section is formed, through an inner wall surface of the through hole, to a second surface opposite to the first surface.

An electronic instrument according to the present invention comprises an optical element which includes a semiconductor chip having an optical section and an electrode electrically connected to the optical section, wherein the semiconductor chip has a through hole, and a conductive layer formed from a first surface of the semiconductor chip on which the optical section is formed, through an inner wall surface of the through hole, to a second surface opposite to the first surface.

BRIEF DESCRIPTION OF THE DRAWINGS

FIGS. 6A to 6G illustrate a process of a method of manufacture of the first embodiment of the photoreceiver element of the present invention.

FIGS. 7A to 7G illustrate a process of a method of manufacture of the base for the first embodiment of the photoreceiver element of the present invention.

DETAILED DESCRIPTION

Figure 1:
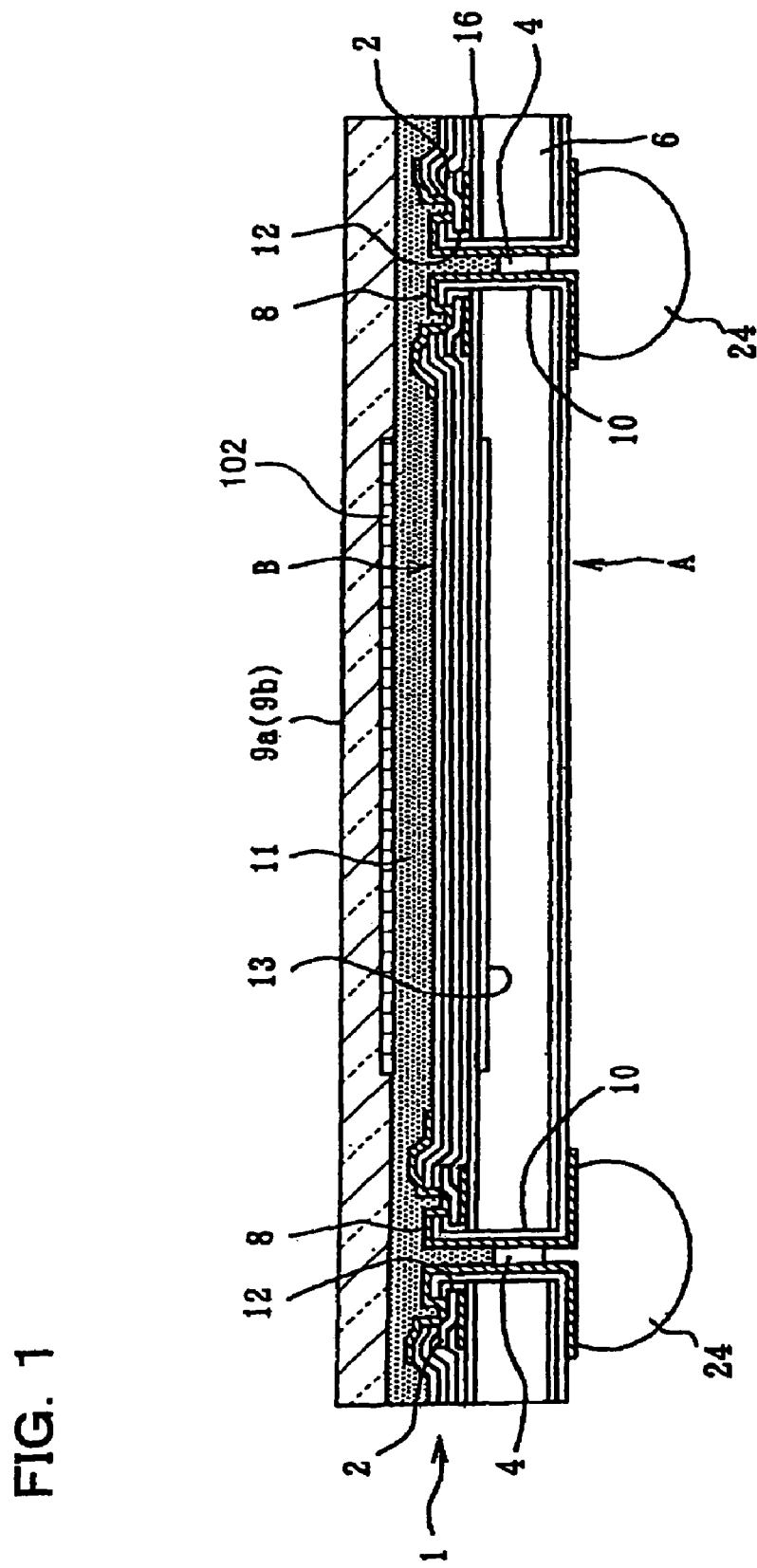
FIG. 1 is an enlarged sectional view of first embodiment of the photoreceiver element of the present invention.

In this embodiment, an optical element and method of manufacture thereof, and an electronic instrument can be provided whereby the above problems can be overcome, more compact devices can be achieved, and electrical conduction can be obtained on both surfaces.

(1) A method of manufacturing an optical element according to the embodiment of the present invention comprises the steps of:

forming a through hole in a semiconductor element which has an optical section and an electrode electrically connected to the optical section; and forming a conductive layer extending from a first surface of the semiconductor element on which the optical section is formed, through an inner wall surface of the through hole, to a second surface opposite to the first surface.

According to the embodiment of the present invention, the through hole is formed in the semiconductor element, and the conductive layer is formed extending from the first surface of the semiconductor element on which the optical section is formed, through the inner wall of the through hole, to the second surface opposite to the first surface. Therefore, the electrical connection with the exterior is achieved by using the conductive layer formed to extend to the second surface. For this reason, a conventional ceramic package or the like for forming external electrodes is not required, the cost can be reduced, and further the mounting area is greatly reduced, and higher density mounting is made easy.

(2) In this method of manufacturing an optical element, an external electrode which is electrically connected to the conductive layer may be formed on the second surface of the semiconductor element.

(3) In this method of manufacturing an optical element, after forming a stress relieving layer on the second surface of the semiconductor element, the conductive layer may be formed over the stress relieving layer.

(4) In this method of manufacturing an optical element, after forming a stress relieving layer on the second surface of the semiconductor element, the conductive layer may be formed over the stress relieving layer, and the external electrode may be formed in a position on the second surface corresponding to the stress relieving layer.

(5) In this method of manufacturing an optical element, the semiconductor element may be a semiconductor chip cut from a semiconductor wafer.

(6) In this method of manufacturing an optical element, the semiconductor element may be part of a semiconductor wafer, and the semiconductor wafer may be cut into individual chips each of which is the semiconductor element.

If the semiconductor element is part of a semiconductor wafer, at the stage of the semiconductor wafer before dicing into individual semiconductor chips, the electrical connection between the first and second surfaces can be achieved. Therefore, the manufacturing procedure is simplified.

(7) In this method of manufacturing an optical element, after forming the conductive layer, a light-transmitting member may be provided on the first surface.

(8) In this method of manufacturing an optical element, after forming the conductive layer, a light-transmitting member may be provided on the first surface; and the light-transmitting member may be of substantially the same shape as the semiconductor chip.

(9) In this method of manufacturing an optical element, after forming the conductive layer, a light-transmitting member may be provided on the first surface; and the light-transmitting member may be of substantially the same shape as the semiconductor wafer.

(10) In this method of manufacturing an optical element, after forming the conductive layer, a light-transmitting member may be provided on the first surface;

the light-transmitting member may be of substantially the same shape as the semiconductor element of the semiconductor wafer;

the electrical characteristics of the semiconductor element of the semiconductor wafer may be tested to determine satisfactory portions; and the light-transmitting member may be provided on the semiconductor element determined to be satisfactory portions.

By means of this, the electrical characteristics of each semiconductor element of the semiconductor wafer are tested and satisfactory portions are determined, then the light-transmitting member is provided on such of the semiconductor elements as are determined to be satisfactory portions. Therefore, since no light-transmitting member is provided on a faulty semiconductor element, waste of the light-transmitting members is eliminated, and the yield is increased, while the manufacturing cost can be held down.

(11) In this method of manufacturing an optical element, the light-transmitting member may be provided after the semiconductor wafer is cut.

(12) In this method of manufacturing an optical element, the light-transmitting member may be an optical glass.

(13) In this method of manufacturing an optical element, a color filter may be provided on the first surface.

(14) In this method of manufacturing an optical element, after forming the conductive layer, microlenses may be provided on the first surface.

(15) An optical element according to the embodiment of the present invention comprises a semiconductor chip which has an optical section and an electrode electrically connected to the optical section, wherein the semiconductor chip includes a through hole, and a conductive layer extending from a first surface of the semiconductor ship on which the optical section is formed, through an inner wall surface of the through hole, to a second surface opposite to the first surface.

According to this embodiment, the semiconductor chip has a through hole, and a conductive layer formed from a first surface on which the optical section is formed, through the inner wall surface of the through hole, to a second surface opposite to the first surface. The electrical connection with the exterior is achieved using the conductive layer formed to extend to the second surface. For this reason, a conventional ceramic package or the like for forming external electrodes is not required, the cost can be reduced, and further the mounting area is greatly reduced, and higher density mounting is made easy.

(16) This optical element may further comprise an external electrode formed on the second surface of the semiconductor chip, and electrically connected to the conductive layer.

(17) This optical element may further comprise a stress relieving layer formed on the second surface of the semiconductor chip, and the conductive layer may be formed over the stress relieving layer.

(18) This optical element may further comprise a stress relieving layer formed on the second surface of the semiconductor chip, and the conductive layer may be formed over the stress relieving layer, and the external electrode may be formed in a position on the second surface corresponding to the stress relieving layer.

(19) This optical element may further comprise a light-transmitting member provided on the first surface of the semiconductor chip.

(20) In this optical element, the light-transmitting member may be of substantially the same shape as the semiconductor chip.

(21) In this optical element, the light-transmitting member may be an optical glass.

(22) The optical element may further comprise a color filter provided on the first surface of the semiconductor chip.

(23) The optical element may further comprise a microlens provided on the first surface of the semiconductor chip.

(24) An electronic instrument according to the embodiment of the present invention comprises an optical element which includes a semiconductor chip having an optical section and an electrode electrically connected to the optical section, wherein the semiconductor chip has a through hole, and a conductive layer formed from a first surface of the semiconductor chip on which the optical section is formed, through an inner wall surface of the through hole, to a second surface opposite to the first surface.

(25) This electronic instrument may further comprise a display section which displays an image based on a signal from the optical element.

The present invention is now described in terms of embodiments, with reference to the drawings. In the following embodiments a photoreceiver element is described as one example of an optical element, but the present invention is not limited to this, and the optical element may be a light emitting element. The optical element has an optical section. When the optical element is a photoreceiver element, the optical section is a photoreceiver, and when the optical element is a light emitting element, the optical section is a photoemitter.

First Embodiment

Figure 2:
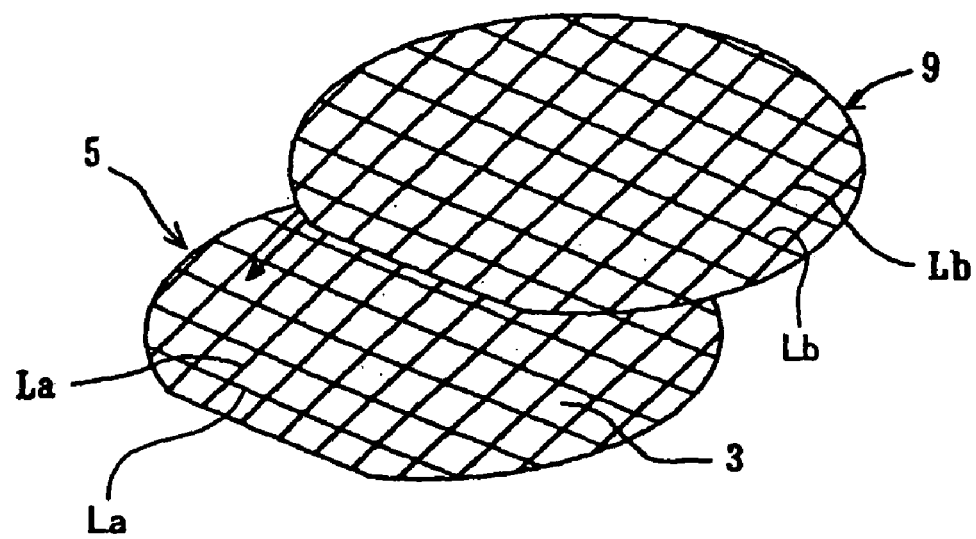
FIG. 2 is an explanatory illustration of a first method of manufacture of the first embodiment of the photoreceiver element of the present invention.

FIG. 1 is an enlarged sectional view of first embodiment of the photoreceiver element of the present invention, and FIG. 2 is an explanatory illustration of a first method of manufacture of this embodiment of the photoreceiver element, showing the relationship between a semiconductor wafer 5 forming the base and an optical glass 9 (light-transmitting member) to be adhered thereto. It should be noted that in FIG. 2, the example shown is of an optical glass 9 used as the light-transmitting member, but for the material of the light-transmitting member, in addition to glass, for example resin (plastic) or the like may be used.

Figure 3:
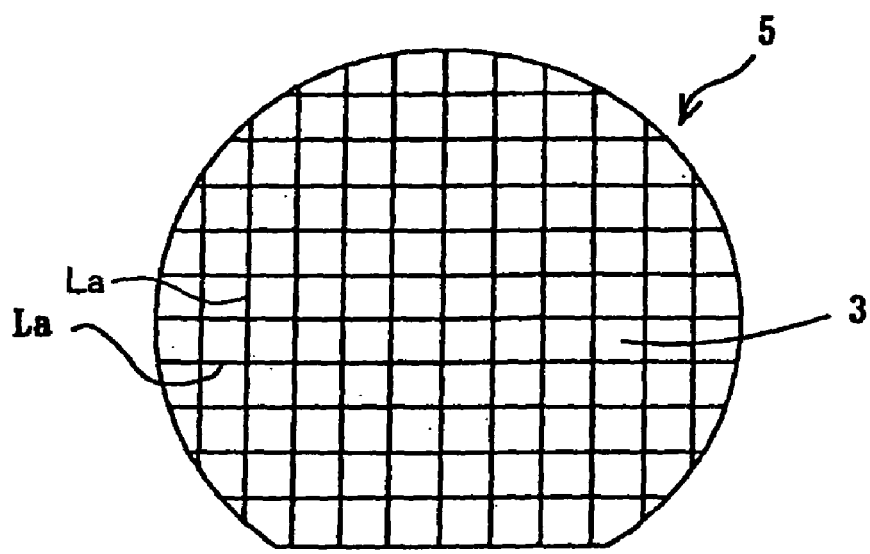
FIG. 3 illustrates a process of a second method of manufacture of the first embodiment of the photoreceiver element of the present invention.
Figure 4:
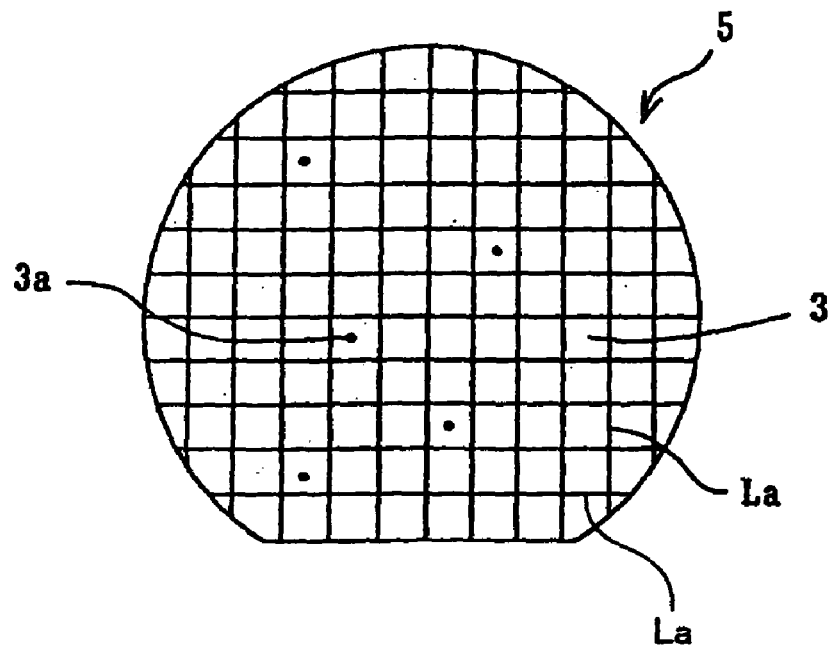
FIG. 4 illustrates a process of the second method of manufacture of the first embodiment of the photoreceiver element of the present invention.
Figure 5:
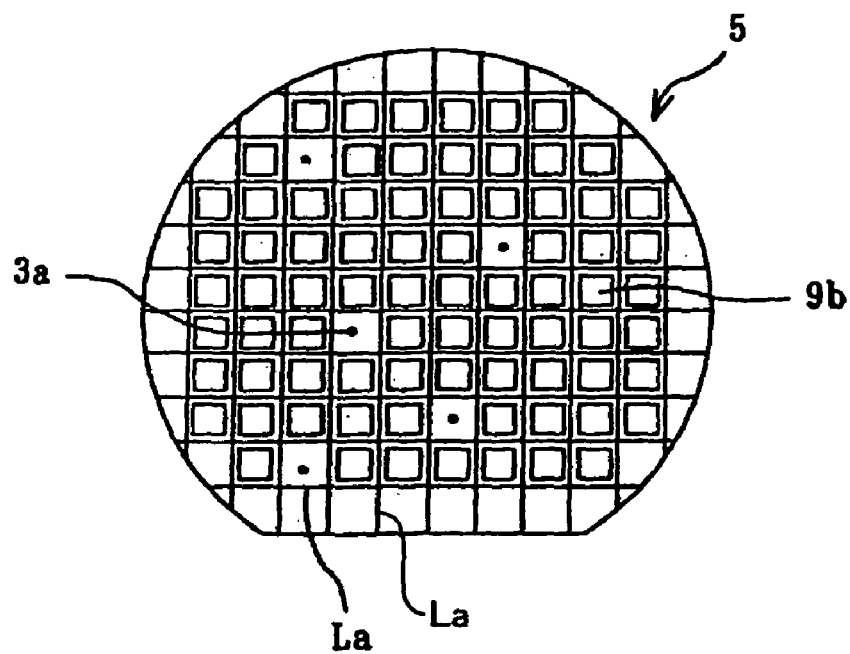
FIG. 5 illustrates a process of the second method of manufacture of the first embodiment of the photoreceiver element of the present invention.

FIGS. 3 to 5 illustrate the process of a second method of manufacture of the photoreceiver element of this embodiment, in which FIG. 3 shows a semiconductor wafer on which is formed a plurality of semiconductor elements 3 having photoreceivers, FIG. 4 shows the state when the electrical characteristics have been tested and semiconductor elements 3 that have failed the test are labeled "Bad" marks 3a, and FIG. 5 shows the state where those semiconductor elements 3 determined to be satisfactory have optical glass (hereinafter referred to as optical glass chips 9b) adhered. It should be noted that in this embodiment, the semiconductor elements 3 refer either to the parts of the semiconductor wafer 5 or to the diced semiconductor chips 6.

The photoreceiver element 1 of this embodiment may undergo packaging (formation of conductive layers and the like) at the wafer level. In that case, the photoreceiver element 1 is that obtained by dicing into the individual semiconductor elements 3 of FIG. 2 or FIG. 5. Alternatively, the photoreceiver element 1 may undergo packaging (formation of conductive layers and the like) after already being diced into individual semiconductor chips.

As shown in FIG. 1, the photoreceiver element 1 comprises a semiconductor chip 6 having a photoreceiver 13, and electrodes 2 electrically connected to the photoreceiver 13. The semiconductor chip 6 has a first surface B on which the photoreceiver 13 is formed, and a second surface A opposite to the first surface B. The electrodes 2 are commonly formed on the first surface B. It should be noted that the semiconductor chip 6 is one of the semiconductor elements 3 (see FIGS. 2 and 3) cut from the semiconductor wafer 5.

The semiconductor chip 6 has through holes 4 extending from the first surface B to the second surface A. A conductive layer 8 is formed to extend from the electrodes 2 formed on the first surface B, including the inner wall of the through holes 4 of the semiconductor chip 6, to the second surface A. In other words, the conductive layer 8 is electrically connected at one end to the electrodes 2, and at the other end is formed to reach second surface A.

The photoreceiver element 1 may have solder balls 24 forming external electrodes formed on the conductive layer 8 on the periphery of the through holes 4 on the second surface A of the semiconductor chip 6. The photoreceiver element 1 may have an optical glass 9a or optical glass chip 9b adhered to the first surface B of the semiconductor chip 6 by an adhesive 11 being a transparent resin or low melting point glass or the like.

The electrodes 2 have holes 12 formed therein that communicate with the through holes 4 through the insulating film 10. The conductive layer 8 is formed by lamination on at least a part of the electrodes 2. On the inside of the through holes 4, the insulating film 10 is formed under the conductive layer 8, preventing electrical connection with the circuit formed within the semiconductor chip 6. Then by means of the conductive layer 8, electrical connection between the first surface B of the semiconductor chip 6 and the second surface A is achieved.

The optical glass 9a or optical glass chip 9b here has the entire surface adhered to the photoreceiver 13, but this is not a restrictive condition, and for example may be adhered so that the periphery surrounds the photoreceiver 13.

If the photoreceiver element 1 is a color imaging element, as shown in FIG. 1, on the optical glass 9a (or optical glass chip 9b) a color filter 102 may be formed. The color filter 102 comprises a coloring layer, protective film, and so on, and is formed in one-to-one correspondence with the pixel electrodes (photoreceivers 13). The color filter 102 is formed, for example, by well-known methods such as dyeing, pigmenting, electrodeposition, or printing. By forming the color filter 102 on the optical glass 9a (or optical glass chip 9b) as a separate member from the semiconductor chip 6, the manufacturing procedure is made simpler than by direct formation on the semiconductor chip 6.

The semiconductor chip 6 has an insulating film (interlayer film) 16 on the surface on which the photoreceiver 13 is formed. The insulating film 16 is commonly a film of the oxide of the silicon which is the basic material of the semiconductor chip. On the insulating film 16, the electrodes (pads) 2 are formed, and the electrodes 2 are electrically connected to the photoreceiver 13 by a portion not shown in the drawings. The electrodes 2 are commonly formed of a metal such as aluminum, copper or the like. The electrodes 2 are aligned along at least one side (commonly two sides or four sides) of the surface of the semiconductor chip 6.

Next, a first method of manufacture of the above described photoreceiver element 1 is described based on the processes in FIGS. 2, and 6A to 8B, with reference to FIG. 1.

First Method of Manufacture

First, the procedure for creating the semiconductor chip 6 is described based on FIGS. 6A to 8B, and with reference to FIGS. 1 and 2. It should be noted that in the example described below, the conductive layer and the like are formed at the wafer level (in the semiconductor wafer state).

As shown in FIG. 6A, before dicing into individual semiconductor chips 6, on the semiconductor wafer 5 the insulating film 16 is formed on the surface on which the photoreceiver 13 is formed, and on the insulating film 16 an underlying layer 2a for the electrodes 2 is formed. Then at the extremity of the underlying layer 2a, an insulating film 28 is laminated on the underlying layer 2a, and the upper layer 2b of the electrodes 2 is formed to extend over the insulating film 28. A passivation film 30 is formed avoiding the center portion and covering the extremity of the electrodes 2. The passivation film 30 can be formed of, for example, $SiO_2$, SiN, polyimide resin, or the like.

First, on the first surface B of the semiconductor wafer 5, that is, the surface on which the photoreceiver 13 and electrodes 2 are formed, a resist 32 is formed, also covering the electrodes 2. As the method of forming the resist 32 can be used spin coating, dipping, or spray coating. The resist 32 covers the portions not to be etched in a process of etching described below, and may be any of a photoresist, an electron beam resist, or an X-ray resist, and may be either positive or negative. The resist 32 used in this embodiment is a positive photoresist. After coating with the resist 32, to prevent sticking to other materials, prebaking is applied, and the solvent evaporated.

Next, as shown in FIG. 6B, the resist 32 is patterned. In more detail, a mask is disposed on the resist 32, and it is irradiated with energy. The energy depends on the nature of the resist 32, and any of light, electron beams, or X-rays may be used. In this embodiment, a photoresist 32 is used, and is exposed to light. The shape of the mask is determined by the patterning shape, and it may have a reverse shape depending on whether the resist 32 is positive or negative.

After exposure to light, the resist 32 is developed and subjected to post-baking. In the patterned resist 32, an opening 34 is formed, exposing the center portion of the electrodes 2.

As shown in FIG. 6C, the center portion of the electrodes 2 exposed by the opening 34 of the resist 32 is etched. For the etching, dry etching is preferably applied. The dry etching may be reactive ion etching (RIE). As the etching, wet etching may also be applied. Thus, in the center portion of the electrodes 2 (portion excluding the extremity) a hole 36 is formed. The hole 36 is formed in the position of the through holes 4 described in FIG. 1 above. In more detail, the hole 36 is in substantially the same position as the opening extremity of the through hole 4, or is formed with a larger size, and communicates with the through hole 4.

Then after the resist 32 is removed, as shown in FIG. 6D, on the surface of the semiconductor wafer 5 on which the electrodes 2 are formed (the first surface B), and on the opposite surface (the second surface A), insulating films 38 and 40 are formed. The insulating films 38 and 40 may be silicon oxide film or nitride film, and can be formed by chemical vapor deposition (CVD). The insulating film 38 on the first surface B covers the electrode 2 and passivation film 30. Since the hole 36 is formed in the electrode 2, the insulating film 38 also covers the interior of the hole 36 (inner wall and exposed insulating film 16).

Next, as shown in FIG. 6E, after resists 42 and 44 are formed on the first surface B of the semiconductor wafer 5 and the second surface A, these resists 42 and 44 are patterned, and in the positions described in FIG. 1 above for the through holes 4, openings 46 and 48 are formed. The opening 46 is formed on the inside of the hole 36 in the electrode 2, so that the insulating film 38 is present between the hole 36 and the opening 46. Therefore, the openings 46 and 48 expose parts of the insulating films 38 and 40. It should be noted that the shape of the resists 42 and 44 and the method of their patterning are governed by the content of the above description of the resist 32. One of the resists 42 and 44 (for example the resist 42) may be formed (for example on the first surface B of the semiconductor wafer 5), then prebaking applied, and then the other (for example the resist 44) formed, and then this subjected to prebaking.

As shown in FIG. 6F, a hole 50 is formed in the insulating films 16 and 38 on the inside of the hole 36 in the electrode 2, and a hole 52 is formed in the insulating film 40.

As shown in FIG. 6G, the resists 42 and 44 are removed. Then, as shown in FIG. 7A, the part of the semiconductor wafer 5 exposed by the holes 50 and 52 is etched. This etched portion is the portion where the photoreceiver 13 is not formed, and is formed of silicon. By means of this etching, depressions 54 and 56 which can easily be visually recognized are formed on the surface of the semiconductor wafer 5. The shape of the depressions 54 and 56 is not particularly restricted, but may be a shape with a taper, or may have walls perpendicular to the surface. For the etching, the application of wet etching is simple, but dry etching may equally be applied. The shape of the depressions 54 and 56 is determined by the type of etching.

As shown in FIG. 7B, a pore 58 (for example, diameter substantially 20 µm) is formed in the semiconductor wafer 5. The pore 58 has a smaller diameter than the through holes 4 described above in FIG. 1, and is formed at the center of the through hole 4. For the formation of the pore 58, a laser (for example, a YAG laser or $CO_2$ laser) can be used. The laser beam can be irradiated to detect the positions of the above described depressions 54 and 56. The laser beam may be irradiated from one side only of the semiconductor wafer 5 to form the pore 58, or a laser beam may be irradiated from both sides of the semiconductor wafer 5 (in sequence, or simultaneously). If the laser beam is irradiated from both sides, the effect on the semiconductor wafer 5 is reduced.

As shown in FIG. 7C, a through hole 4 is formed in the semiconductor wafer 5. The through hole 4 is formed by enlarging the above described pore 58. For example, wet etching may be applied, and the inner wall of the pore 58 etched. As etchant, for example, an aqueous solution of a mixture of hydrogen fluoride and ammonium fluoride (buffered hydrofluoric acid) may be used.

The through hole 4 here is formed so that at all points in the axial direction the opening cross-section has substantially the same diameter, but this through hole may be formed so as to have a form with for example an opening extremity, and an intermediate portion of larger diameter than the opening extremity (for example, of diameter substantially 40 to 50 µm). If in this way the diameter of the intermediate portion of the through hole is made as large as possible, the CVD or electroless plating described below can be carried out more easily. When, as in this example, the through hole 4 is formed to be straight, the loss of strength of the semiconductor wafer 5 due to the formation of the through hole 4 can be limited. It should be noted that the through hole 4 may equally have a taper connecting the opening extremity and the intermediate portion to each other. The taper may also be formed by enlarging the pore 58 by wet etching.

Next, as shown in FIG. 7D, at least on the inner wall of the through hole 4 the insulating film 10 is formed. To form the insulating film 10, CVD may be applied. The insulating film 10 may also be formed in regions other than the inner wall of the through hole 4. For example, the insulating film 10 may also be formed on the insulating films 38 and 40. However, the insulating film 10 must not be allowed to block the opening of the through hole 4.

Next, as shown in FIG. 7E, on the first surface B of the semiconductor wafer 5, a resist 64 is formed to block the opening at one end of the through hole 4 in the semiconductor wafer 5, after which the resist 64 is patterned, and an opening

68 is formed. It should be noted that when the resist 64 is formed, a resist 66 may also be formed on the second surface A. Then the resists 64 and 66 undergo prebaking. For the method of formation and patterning of the resists 64 and 66, the description of the above described resist 32 can be applied. The opening 68 is formed over at least a part of the electrode 2, but over the through hole 4, a part of the resist 64 is left remaining. For example, the opening 68 is formed with an annular shape, between an outer periphery included within the region of the electrode 2, and an inner periphery covering at least the extremity of the opening of the through hole 4. It should be noted that the annular shape mentioned here may be a polygonal annular shape or equally a round annular shape. The opening 68 exposes a part of the insulating film 10.

Next, as shown in FIG. 7F, with the patterned resist 64 as a mask, the insulating films 10 and 38 are etched, and a part of the electrode 2 is exposed. The part exposed here is the part for achieving an electrical connection, and is therefore preferably large. Thereafter, as shown in FIG. 7G, the resists 64 and 66 are removed.

Figure 8A:
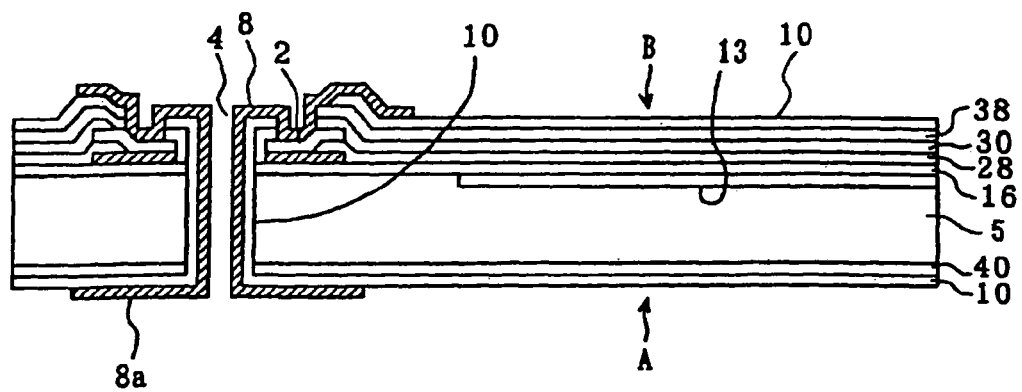
FIGS. 8A and 8B illustrate a process of a method of manufacture of the first embodiment of the photoreceiver element of the present invention.

Next, to form the conductive layer, a resist is formed on the first surface B of the semiconductor wafer 5 and the second surface A, which is then patterned and prebaked. Next, as shown in FIG. 8A, the conductive layer 8 is formed in a region from the electrode 2 on the first surface B to the second surface A, and including also the inner wall of the through hole 4 (here the surface of the insulating film 10 within the through hole 4).

To describe the process of formation of this conductive layer 8 in more detail, first a resist (not shown in the drawings) is formed on the first surface B and second surface A of the semiconductor wafer 5. Since the resist on the first surface B is formed in a region of large differences of height, it is preferably a pre-formed film (dry film).

Next, the resist on the first surface B and second surface A of the semiconductor wafer 5 is patterned, and an opening (not shown in the drawings) communicating with the through hole 4, and an interconnect pattern (not shown in the drawings) connecting with the opening are formed. The opening in the first surface B exposes a part of the electrode 2.

Next, an electroless plating catalyst (not shown in the drawings) is applied from the through hole 4 extending over the exposed portion of the electrode 2. Here, palladium is used as the catalyst. As the method of forming the catalyst, for example the semiconductor wafer 5 may be immersed in a mixed solution including palladium and tin, and then treated with an acid such as hydrochloric acid, whereby only the palladium is deposited. Alternatively, the semiconductor wafer 5 may be immersed in a solution of tin chloride, whereby tin ions (reducing agent) are adsorbed, and then the semiconductor wafer 5 may be immersed in a palladium chloride solution, and the palladiums ion reduced by the tin ions (reducing agent) to deposit palladium nuclei (catalyst).

Alternatively, the catalyst may be directly applied by an inkjet technique. In using an inkjet technique, the technology developed for inkjet printers is applied, and the catalyst can be deposited rapidly and economically with no waste. An inkjet head developed as a product for an inkjet printer or the like may be used, for example a piezo jet type using a piezoelectric element, or a Bubble Jet (registered trade mark) type using an electrothermal transducer as an energy emitting element, and this allows the ejection area and ejection pattern to be controlled as required. By means of this, without requiring a resist patterning step and a resist removal step, and in the case that a metal layer is formed over the whole surface, without requiring an etching step, the electrical connection portions can be formed.

Next, the resist is removed from the first surface B and second surface A of the semiconductor wafer 5. By removing the resist, the catalyst can be provided only in the region in which it is desired to form the electrical connection portion. When removing the resist, ultraviolet radiation may be irradiated, and immersion in a weak alkali solution may be used to remove the resist. By means of this, the resist can be removed easily and reliably.

It should be noted that here after patterning the resist the catalyst is provided, and thereafter the resist is removed, whereby the catalyst is exposed in the region in which the electrical connection portion is to be formed, but the invention is not limited to this. For example, after providing the catalyst over the whole surface, the resist may be provided by patterning to exclude the region of formation of the electrical connection portion, whereby as a result the catalyst is exposed in the region of formation of the electrical connection portion. In this case, the resist is removed after the electrical connection portion is formed.

Next, in the region in which the catalyst is exposed, the conductive layer 8 is formed by the electroless plating described above. It should be noted that the catalyst is provided on the inner wall of the through hole 4 (here the surface of the insulating film 10) and on the first surface B and second surface A of the semiconductor wafer 5. Therefore, the conductive layer 8 is formed continuously over the first surface B and second surface A of the semiconductor wafer 5 via the through hole 4. The conductive layer 8 is laminated on the electrode 2.

As the material of the conductive layer 8 can be used any of Ni, Au, Ni+Au, Cu, Ni+Cu, and Ni+Au+Cu. For example, using a copper plating fluid, the palladium catalyst acts as nuclei to reduce the copper ions in solution, and deposit the copper (the conductive layer 8). It should be noted that as the conductive material for forming the conductive layer 8 a plurality of different metals (for example, Ni+Cu, or Ni+Au+Cu) may be used, and by means of this the conductive layer 8 may be formed as a plurality of layers.

For electroless plating, a weak alkali copper plating solution may be used. As the weak alkali (pH value around 9) copper plating may be used, for example, PB-570, being a mixture of PB-570MU, PB-570A, PB-570B, PB-570C, and PB-570S (manufacturer: EBARA-UDYLITECO., LTD.). By means of this, since the copper plating fluid is a weak alkali, even if the electrode 2 is for example of aluminum, the damage thereto can be minimized.

Alternatively, if a conductive layer not shown in the drawings is formed on the surface of the electrode 2 protecting the electrode 2, a strongly alkaline solution can also be used. The conductive layer 8 may be a single layer, or may equally be a plurality of layers. For example, the conductive layer 8 may be formed of two layers, of nickel and gold. As a method of forming the conductive layer 8 of nickel, first zincate treatment may be applied over the electrode 2, replacing the surface of the aluminum with zinc, and then by immersion in an electroless nickel plating fluid, through a zinc and nickel replacement reaction, nickel may be deposited. Alternatively, the aluminum may be immersed in a palladium solution which is selectively adsorbed by the aluminum only, and then immersed in an electroless nickel plating fluid, in which the palladium acts as nuclei, to deposit a film of nickel. The conductive layer 8 may be formed only of nickel, or by further immersion in an electroless gold plating fluid, a film of gold may be further formed on the surface of the nickel. By forming the gold film, the electrical connection with the conductive layer 8 can be further made more positive.

All of the above described examples are of methods of forming the conductive layer 8 which use a wet method (plating), but as other methods may equally be used a conventional dry method (sputtering or the like), or a combination of a dry method and a wet method.

It should be noted that the portion of the conductive layer 8 on the electrical connection portion on the second surface A around the periphery of the through hole 4 preferably has the conductive layer made thicker (for example, at least substantially 5 μm).

By means of the above process, the conductive layer 8 is formed, and a part of the conductive layer 8 on the second surface A forms a seat 8a (see FIG. 8A) for forming solder balls.

Figure 8B:
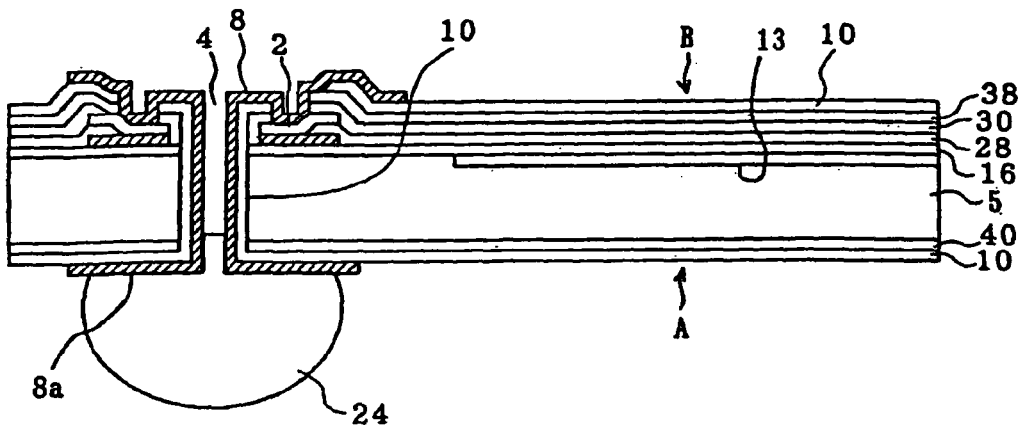

In the process of forming solder balls, as shown in FIG. 8B, on the seat 8a, a solder ball 24 forming an external electrode is formed. The solder ball 24 is formed by first forming a thick layer of solder to form the solder ball on the seat 8a. The thickness of this solder is determined by the amount of solder corresponding to the ball diameter required in subsequent formation of the solder ball. The solder layer is formed by electroplating, printing, or a similar method. Thereafter, by means of the "wet-bag process" at least a hemispherical ball is created, to form the solder ball 24. Here "wet-bag" refers to the formation of a bump of substantially hemispherical shape during the reflow process after formation of the external electrode from solder in the formation position.

Thus as above, the semiconductor wafer 5 having a plurality of semiconductor elements 3 shown in FIG. 2 is obtained.

The semiconductor wafer 5 may be provided with the optical glass 9 (light-transmitting member). As shown in FIG. 2, for example, an optical glass 9 having substantially the same shape as the semiconductor wafer 5 and having dicing lines Lb formed in the same pattern as the dicing lines La of the semiconductor wafer 5 is bonded to a surface of the semiconductor wafer 5, namely the first surface B of the semiconductor element 3, using an adhesive 11 constituted by a transparent resin or low melting point glass, after the dicing lines La and Lb have been aligned with each other. Thereafter, the semiconductor wafer 5 and optical glass 9 are diced together along the dicing lines La and Lb, and the photoreceiver element 1 shown in FIG. 1 is obtained.

Thus, in this embodiment, in each semiconductor element 3 of the semiconductor wafer 5 a through hole 4 is formed, and the conductive layer 8 is formed from the first surface B of the semiconductor element 3 on which the photoreceiver 13 is formed to the opposite second surface A, including the inner wall of the through hole 4 thereof. The electrical connection of the photoreceiver element 1 to the outside is achieved using the conductive layer 8 formed to extend as far as the second surface A. Therefore, a conventional ceramic package or the like forming the external electrodes is not required, the cost can be reduced, and the mounting area can be further greatly reduced to enable easier high density mounting. Since the optical glass 9 is adhered at the stage of the semiconductor wafer 5 before dicing into individual semiconductor elements 3, the manufacturing procedure is simplified, and particle management is not required.

Next, a second method of manufacture of the above described photoreceiver element 1 is described based on the processes in FIGS. 3 to 5, with reference to FIG. 1. It should be noted that for the process of creation of the conductive layer 8 and the like the description of FIGS. 6 to 8 above can be applied. Here, therefore, the description begins from the stage at which the semiconductor wafer 5 having the semiconductor elements 3 has been obtained.

Second Method of Manufacture

First, the electrical characteristics of the semiconductor elements 3 of the semiconductor wafer 5 shown in FIG. 3 are tested, using an LSI tester and a wafer prober, a pass/fail decision is made, and to the semiconductor elements 3 determined as failing, "Bad" marks 3a are applied, as shown in FIG. 4. For the method of applying the "Bad" marks 3a, an ink or laser may be used, or a wafer map (a map of the good and bad components held in memory in a computer) may be used.

Next, to the first surface B of each of the semiconductor elements 3 determined to be satisfactory only, are adhered individual pieces of optical glass as shown in FIG. 5, that is to say, optical glass chips 9b, using an adhesive 11 constituted by a transparent resin or low melting point glass. Thereafter, the semiconductor wafer 5 is diced along the dicing lines La, whereby the photoreceiver element 1 shown in FIG. 1 is obtained.

Thus, in this method of manufacture also, the optical glass chips 9b are adhered at the stage of the semiconductor wafer 5 before dicing into individual semiconductor elements 3, as a result of which the manufacturing procedure is simplified.

Since a conventional ceramic package or the like forming the external electrodes is not required, the cost can be reduced, and the mounting area can be further greatly reduced, enabling easier high density packaging.

Since the optical glass chips 9b are adhered only on the first surface B of each of the semiconductor elements 3 of the semiconductor wafer 5 determined to be satisfactory, no optical glass chips 9b are adhered to faulty photoreceiver chip formation portions, there is no waste of the optical glass chips 9b, and the yield is increased.

Alternatively, after the semiconductor wafer 5 is diced into semiconductor elements 3, the optical glass chips 9b may be adhered to the first surface B of those semiconductor elements 3 determined to be satisfactory.

Second Embodiment

Figure 9:
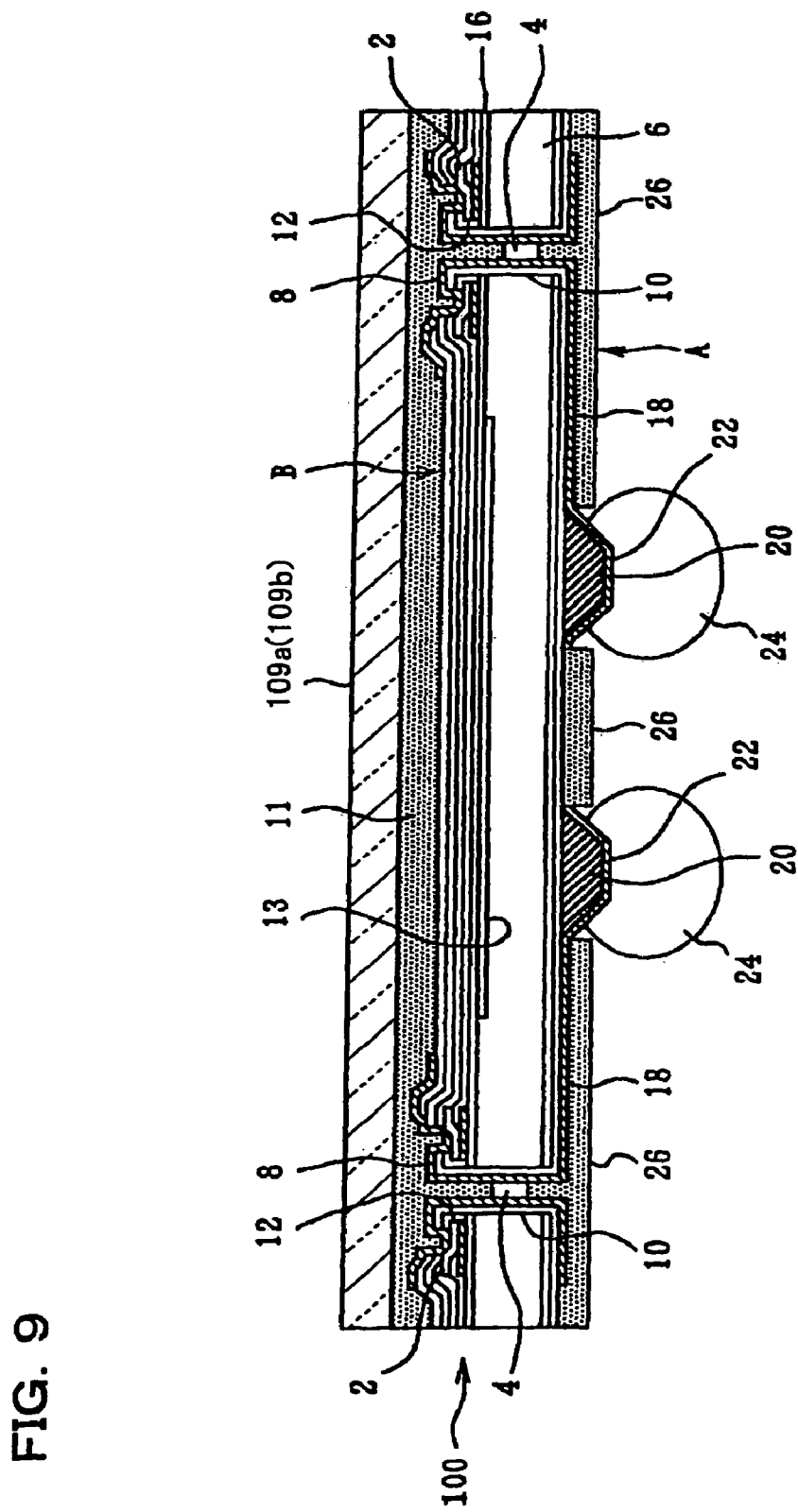
FIG. 9 is an enlarged sectional view of a second embodiment of the photoreceiver element of the present invention.

FIG. 9 is an enlarged sectional view of a second embodiment of the photoreceiver element of the present invention, and in the drawings, parts which are the same as those of the first embodiment in FIG. 1 are given the same reference numerals. It should be noted that in the description, reference is made to the above described FIGS. 2 to 7G.

The photoreceiver element 100 of this embodiment also may have its packaging carried out at the wafer level. The photoreceiver element 100 may be obtained by dicing into individual semiconductor elements 3 (see FIG. 2) after adhering the optical glass 109a (light-transmitting member), or alternatively, after adhering optical glass chips 109b to the semiconductor elements 3 determined to be satisfactory, may be obtained by dicing into individual satisfactory semiconductor elements 3 (see FIG. 5). It should be noted that the optical glass 109a (or optical glass chips 109b) may be a cover glass which covers the photoreceiver 13 of the semiconductor chip 6.

The photoreceiver element 100, as in FIG. 9, comprises the semiconductor chip 6 having electrodes 2 electrically connected to the photoreceiver 13 on the first surface B on which the photoreceiver 13 has been formed. The semiconductor chip 6 is as already described in the first embodiment.

The photoreceiver element 100 has a stress relieving layer 20 formed over part of the second surface A of the semiconductor chip 6. Then the conductive layer 8 is formed from the electrodes 2 over the stress relieving layer 20, including the inner wall of the through hole 4. The photoreceiver element 100 may have solder balls 24 formed on the part of the conductive layer 8 formed over the stress relieving layer 20. That is to say, the part of the conductive layer 8 formed over the stress relieving layer 20 is a seat 22, for accepting the solder balls 24 forming the external electrodes. The photoreceiver element 100 may have a protective film 26 formed with the object of protecting the second surface A and improving the moisture resistance and formed of a solder resist layer covering parts other than the solder balls 24, and also an optical glass 109a (or optical glass chips 109b) adhered to the first surface B of the semiconductor chip 6 by the adhesive 11 constituted by a transparent resin or low melting point glass. It should be noted that the description is of an example in which entire area of the optical glass 109a (or optical glass chips 109b) is adhered to the photoreceiver 13, but this is not a restrictive condition, and for example the optical glass may be adhered so that the periphery thereof surrounds the photoreceiver 13. To other aspects of the construction, the description above of FIG. 1 can be applied.

Next, the method of manufacture of the above described photoreceiver element 100 is described. In this example, as described above, there are broadly two methods of manufacture. In one, to the surface of the semiconductor wafer 5, that is, the surface having the semiconductor elements 3, the optical glass 109a of substantially the same shape as the semiconductor wafer 5, and with dicing lines Lb formed in the same pattern as the dicing lines La of the semiconductor wafer 5 is adhered with an adhesive 11 constituted by a transparent resin or low melting point glass (see FIG. 2), after having the dicing lines La and Lb aligned with each other. Next, the semiconductor wafer 5 and optical glass 109a are diced together along the dicing lines La and Lb, to yield the photoreceiver element 100 shown in FIG. 9. In the other method, the electrical characteristics of the semiconductor elements 3 of the semiconductor wafer 5 are tested, using an LSI tester and a wafer prober, a pass/fail decision is made, and to the photoreceiver chip formation portions 3 determined as failing, "Bad" marks 3a are applied, while to the first surface B of each of the photoreceiver chip formation portions 3 determined to be satisfactory only, are adhered individual optical glass chips 109b by an adhesive 11 constituted by a transparent resin or low melting point glass (see FIGS. 3 to 5). Then the semiconductor wafer 5 is diced along the dicing lines La, and the photoreceiver element 100 shown in FIG. 9 is obtained.

The semiconductor chip 6 is fabricated by the steps shown in FIGS. 6A to 7G and FIGS. 10A to 11C, and for the process up to forming the through hole 4 (FIGS. 6A to 7G) the above description of embodiment 1 can be applied without modification. Therefore, here the description centers on the process of formation of the through hole 4 (FIGS. 10A to 11C).

Figure 10A:
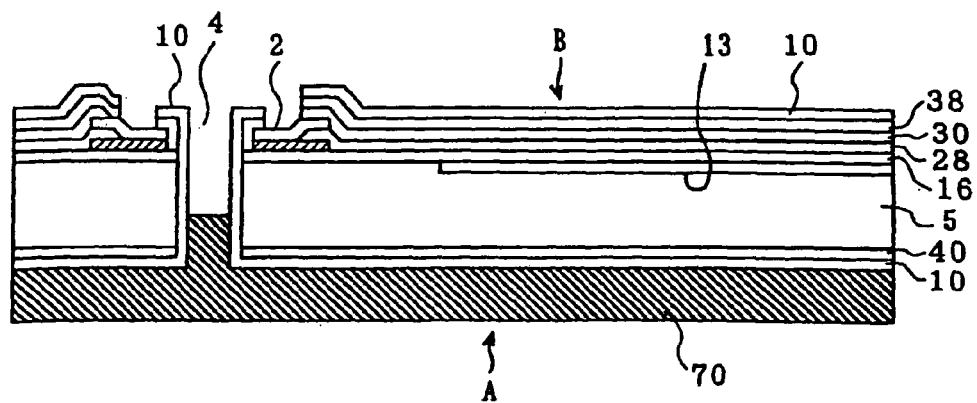
FIGS. 10A to 10C illustrate a process of a method of manufacture of the second embodiment of the photoreceiver element of the present invention.

First, as in FIG. 7G, the through hole 4 is formed in each semiconductor element 3, and on the second surface A of the semiconductor wafer 5 on which apart of the electrode 2 is exposed, as in FIG. 10A, a photosensitive polyimide resin is applied (for example, by the spin-coating method), and a resin layer 70 is formed. The resin layer 70 is preferably formed with a thickness in the range 1 to 100 µm, and more preferably substantially 10 µm. It should be noted that with the spin coating there is a large amount of wasted polyimide resin, and therefore a device ejecting the polyimide resin in a strip by means of a pump may be used. As such an apparatus, for example, the one disclosed in U.S. Pat. No. 4,696,885 may be used. It should be noted that this resin layer 70 has the function of the stress relieving layer 20 described above in FIG. 9.

Figure 10B:
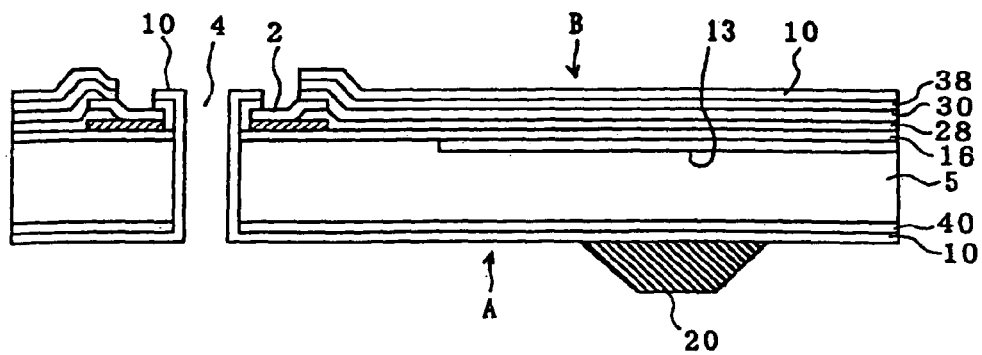

Next, as in FIG. 10B, the resin layer 70 is exposed to light, developed, and baked, whereby the portion forming a seat for the redisposal interconnecting line described below, that is, the stress relieving layer 20, is left remaining and the rest is removed.

It should be noted that here the example of the resin constituting the stress relieving layer 20 described is a photosensitive polyimide resin, but a resin which is not photosensitive may also be used. For example, a silicon denatured polyimide resin, an epoxy resin, or a silicon denatured epoxy resin, or the resin, being a material which when solidified has a low Young's modulus (not more than $1 \times 10^{10}$ Pa), and having a stress relieving effect, may be used. When a non-photosensitive resin is used, it is formed into a predetermined shape thereafter, using a photoresist, and a photo processing process.

Figure 10C:
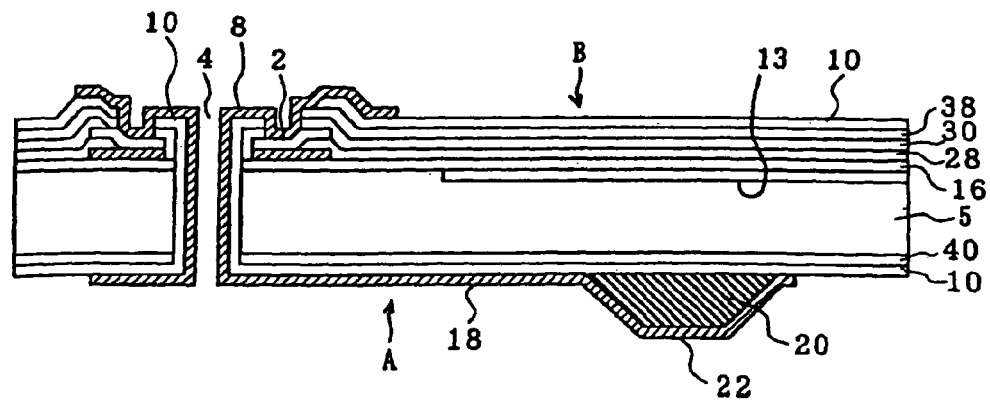

Next, to form the conductive layer, after a resist has been formed on the first surface B and second surface A of the semiconductor wafer 5, it is patterned, and prebaked. Next, as shown in FIG. 10C, the conductive layer 8 is formed in a region that extends from the electrodes 2 on the first surface B to the second surface A, ant that having redisposal interconnecting line 18 and the seat 22 covering the surface of the stress relieving layer 20 on the second surface A, and that also includes the inner wall of the through hole 4 (here the surface of the insulating film 10 inside the through hole 4). For details of the formation of the patterning of the conductive layer 8, the description of embodiment 1 described above in FIGS. 8A and 8B can be applied.

It should be noted that the seat 22 forming the electrical connection portion on the second surface A preferably has the conductive layer formed thickly (for example, at least substantially 5 µm).

By means of the above process, the conductive layer 8 is formed, a part of the conductive layer 8 forms a redisposal interconnecting line 18 on the second surface A, and the end of the redisposal interconnecting line 18 covers the surface of the stress relieving layer 20 formed of resin such as polyimide or the like, whereby this portion forms the seat 22 for forming solder balls.

Figure 11A:
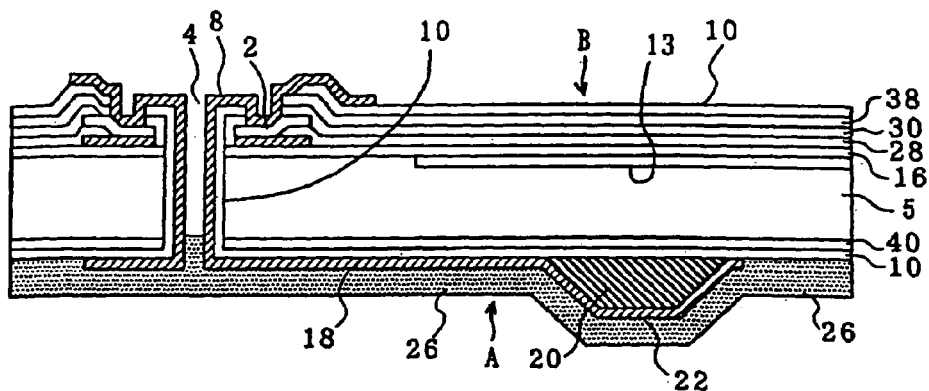
FIGS. 11A to 11C illustrate a process of a method of manufacture of the second embodiment of the photoreceiver element of the present invention.

In the process of formation of the solder balls, first as shown in FIG. 11A, a photosensitive solder resist layer to form the protective film 26 is formed by application over the whole of the second surface A of the semiconductor wafer 5.

Figure 11B:
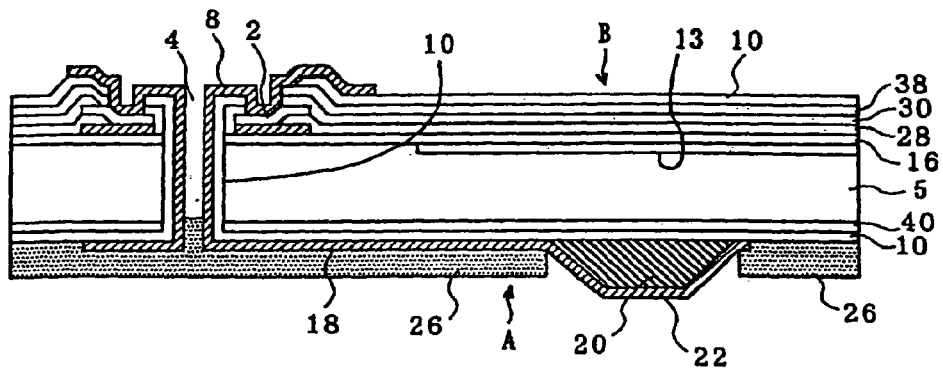

Then exposure to light, development, and baking are carried out, and as shown in FIG. 11B, of the solder resist layer, the region of the portion covering the seat 22 is removed. In this way, the remaining solder resist layer forms the protective film 26 which acts as an anti-oxidation film, and which also works to protect the second surface A of the photoreceiver element 100 in the finished product (FIG. 9) and improve moisture resistance.

Figure 11C:
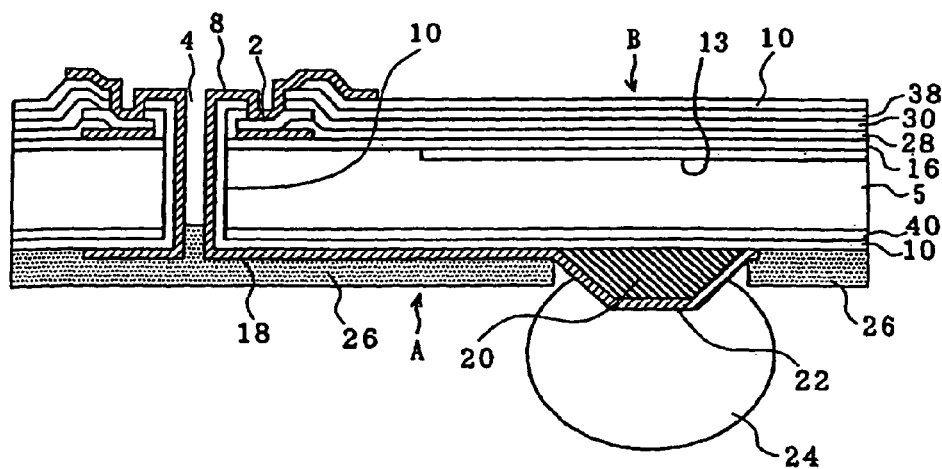

Next, as shown in FIG. 11C, over the seat 22, a solder ball 24 to form an external electrode is formed. As to the formation of the solder ball 24, first a thick layer of the solder to form the solder ball is formed over the seat 22. The thickness of this solder is determined by the amount of solder corresponding to the diameter of the ball in the subsequent formation of the solder ball. The solder layer is formed by electroplating, or printing, or the like. Thereafter, by means of the "wet-bag process", a ball form of at least hemispherical shape is formed, forming the solder ball 24.

Thus as above, semiconductor wafer 5 having a plurality of semiconductor elements 3 as shown in FIG. 1 or FIG. 3 is obtained. Then by means of the thus formed semiconductor elements 3 of the semiconductor wafer 5, when the photoreceiver element 100 (FIG. 9) is finally formed by dicing into individual items, by means of the stress relieving layer 20 of resin, stress due to differences in the coefficient of thermal expansion between the circuit board (not shown in the drawings) and the semiconductor chip 6 is absorbed.

Thus, in this embodiment, the stress relieving layer 20 is formed partially on the second surface A of the semiconductor elements 3 of the semiconductor wafer 5. Further, the conductive layer 8 is formed from the electrodes 2, including the inner wall of the through hole 4, to over the stress relieving layer 20. In this embodiment also, the external electrical connection of the photoreceiver element 100 can be carried out using the conductive layer 8 (redisposal interconnecting line 18) which is formed to extend over the stress relieving layer 20 on the second surface A. Therefore, in addition to the effect described for the first embodiment, by means of the stress relieving layer 20 formed of resin, there is the additional benefit that stress due to differences in the coefficient of thermal expansion between the circuit board (not shown in the drawings) and the semiconductor chip 6 is absorbed.

It should be noted that as another method of manufacture of the photoreceiver element, the photoreceiver chips previously diced into individual chips may have individual pieces of optical glass adhered thereto.

Figure 12:
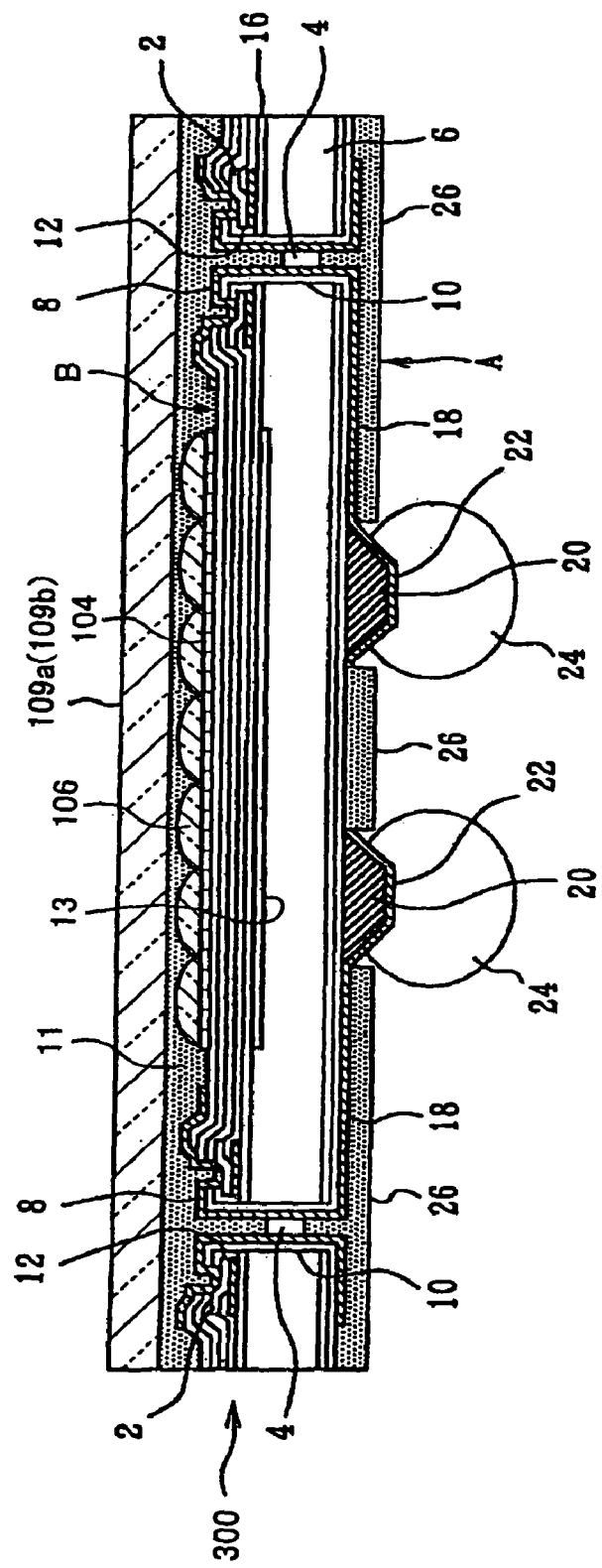
FIG. 12 is an enlarged sectional view of a variant of the second embodiment of the photoreceiver element of the present invention.

FIG. 12 shows a variant of this embodiment of the photoreceiver element. A photoreceiver element 300 further includes in the above described photoreceiver element 100 (see FIG. 9), a color filter 104 and a microlens 106. The color filter 104 and microlens 106 are formed on the first surface B.

In the example shown in FIG. 12, the color filter 104 is directly formed on the surface of the semiconductor chip 6 on which the photoreceiver 13 is formed. The color filter 104 may be formed on each semiconductor element at the stage of the semiconductor wafer. By means of this, since the color filter 104 can be formed on the semiconductor wafer in a single operation, this yields excellent productivity. Alternatively, it may be formed after dicing into individual semiconductor chips 6. The method of formation of the color filter 104 is not restricted, and may for example be the dyeing method of dyeing a previously formed transparent layer, or the pigment method of applying a medium in which a pigment is dispersed. It should be noted that the color filter 104 may be patterned in a particular form by application of a photolithography technique, or may be patterned by a printing method. If the color filter 104 is formed directly over the semiconductor chip 6, it is not necessary to form a color filter on the optical glass 109a (or optical glass chips 109b).

In the example shown in FIG. 12, a plurality of microlenses (convex lenses) 106 are disposed in an array on the first surface B. The microlens 106 is disposed in one-to-one correspondence with the pixel electrodes (for each photoreceiver 13). By means of this, light passing through each photoreceiver 13 can be stopped down. It should be noted that the microlens 106 is formed of glass or resin (plastic) or the like.

In distinction to the example shown in FIG. 12, the color filter 104 may be formed on the surface of the optical glass 109a (or optical glass chips 109b) (see the first embodiment). Alternatively, the color filter 104 may be formed between the optical glass 109a (or optical glass chips 109b) and the microlens 106.

In the example shown in FIG. 12, either of the color filter 104 and microlens 106 may be omitted. For example, when the color filter 104 is omitted, the microlens 106 may be given the function of a color filter.

It should be noted that the color filter 104 and microlens 106 can be formed by the application of methods already known in the art.

Third Embodiment

FIGS. 13 to 15B show an embodiment of an electronic instrument incorporating the photoreceiver element (one example of an optical element) of the present invention. This electronic instrument, more specifically, may be any of a variety of imaging devices including image sensors.

Figure 13:
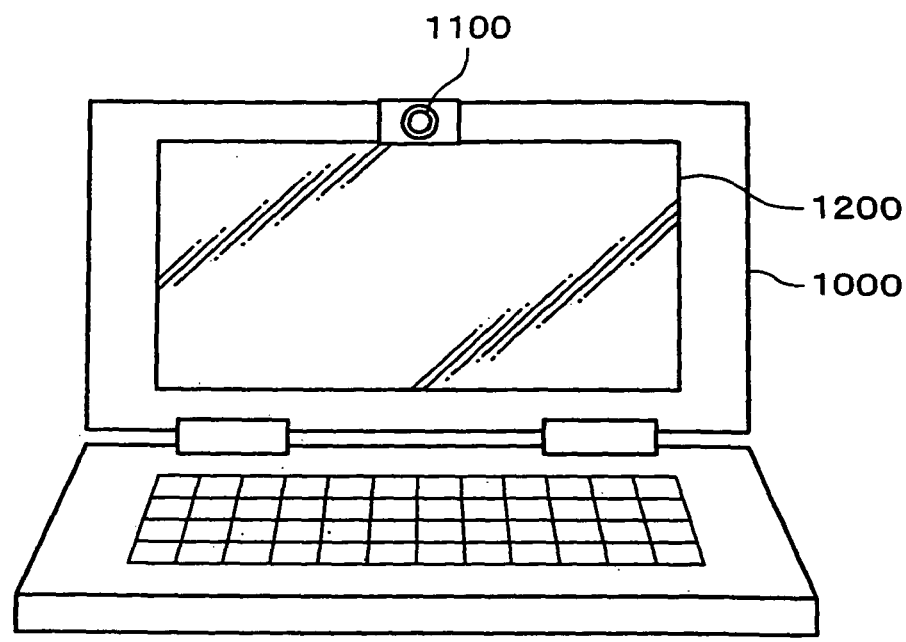
FIG. 13 shows an embodiment of the electronic instrument of the present invention.

In FIG. 13 is shown a personal computer 1000 having an imaging unit 1100 and a display section 1200. This personal computer 1000 captures a subject with the imaging unit 1100, and after converting an optical signal to an electrical signal with the above described photoreceiver element, it displays based on this electrical signal an image with the display section 1200. By means of this, since a compact photoreceiver element is mounted, an electronic instrument which is compact and has a high degree of integration can be provided.

Figure 14:
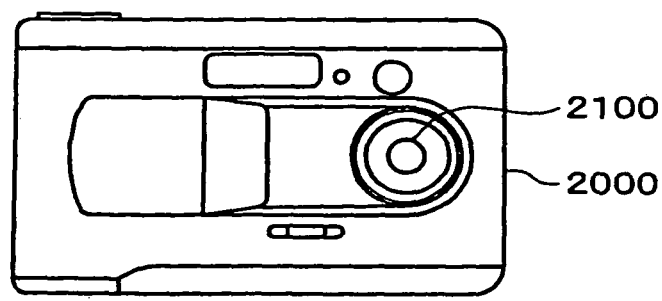
FIG. 14 shows an embodiment of the electronic instrument of the present invention.
Figure 15A:
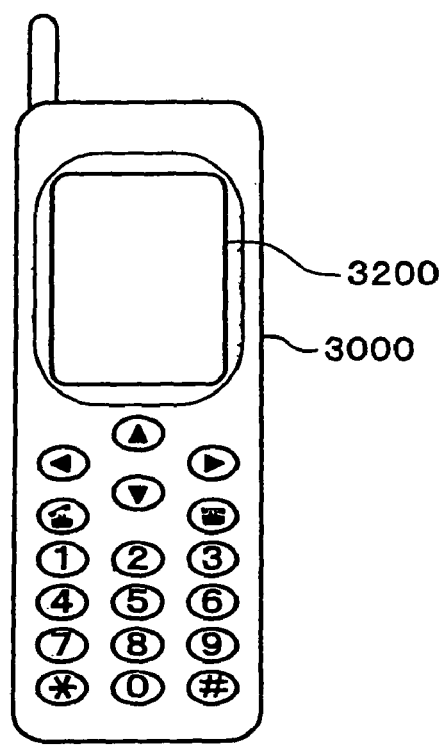
FIGS. 15A and 15B show an embodiment of the electronic instrument of the present invention.
Figure 15B:
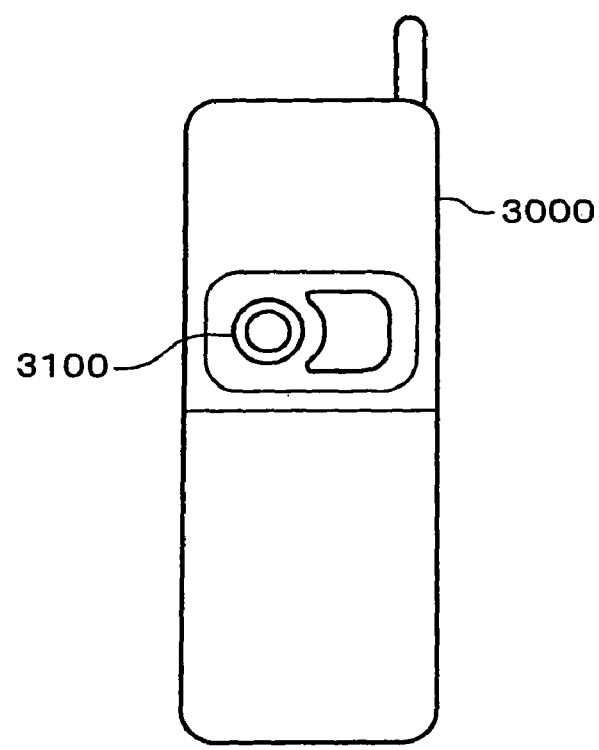
Figure 16:
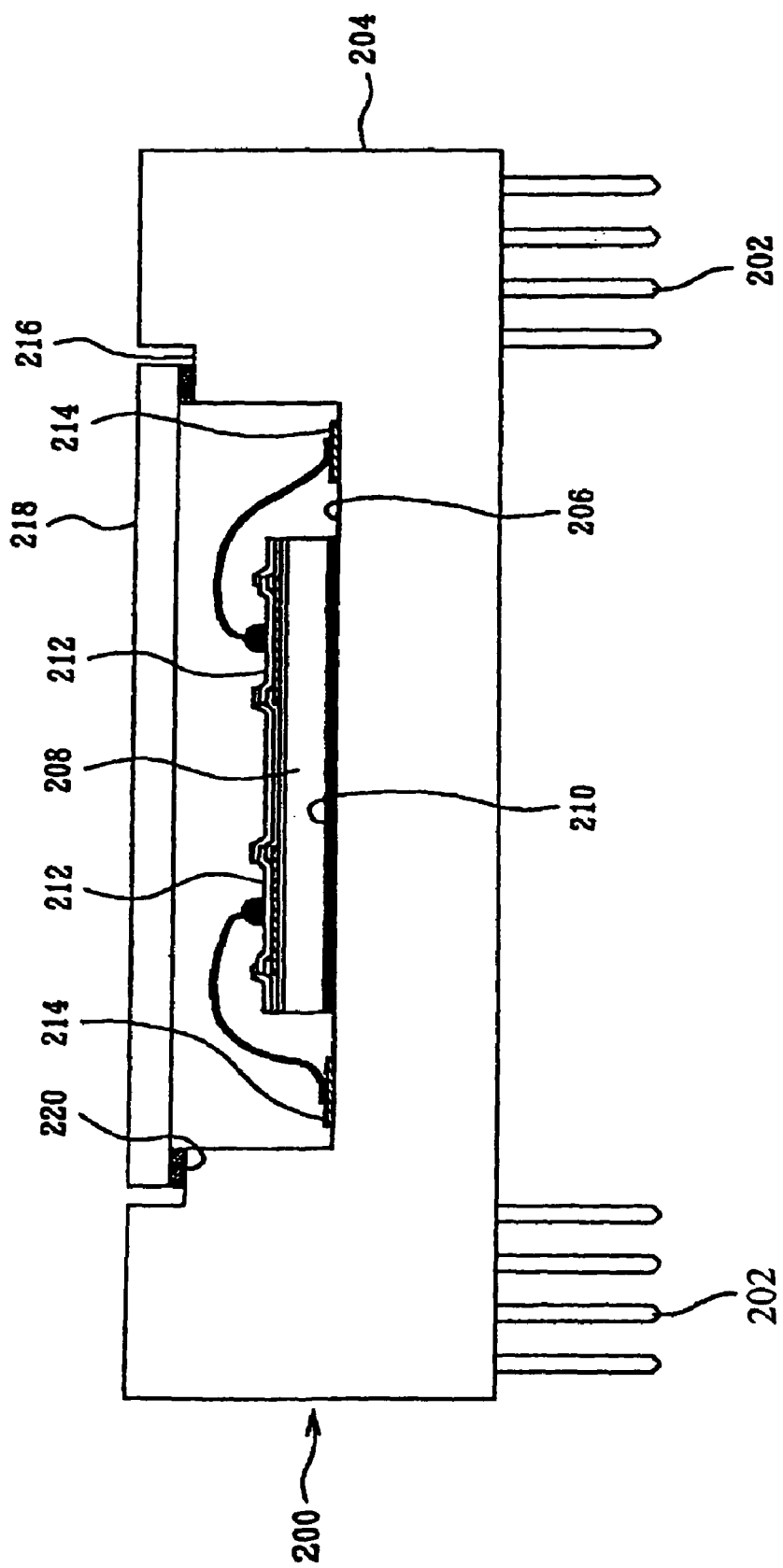
FIG. 16 is an enlarged sectional view of a conventional photoreceiver element package.

As examples of other electronic instruments, in FIG. 14 is shown a digital camera 2000 equipped with an imaging unit 2100, and in FIGS. 15A and 15B is shown a mobile telephone 3000 equipped with an imaging unit 3100 and a display section 3200.

What is claimed is:

1. A method of manufacturing an optical element, comprising:
   forming a through hole in a semiconductor wafer so that the through hole extends from a first surface of the semiconductor wafer to a second surface of the semiconductor wafer, the second surface of the semiconductor wafer being opposite to the first surface of the semiconductor, the first surface of the semiconductor wafer having an optical section, a first electrode being formed on the first surface of the semiconductor wafer;
   forming a conductive layer on an internal wall of the through hole so that the conductive layer is electrically connected to the first electrode; and
   forming a resin on the second surface of the semiconductor wafer;
   wherein a first portion of the conductive layer is formed on the resin in the forming of the conductive layer.

2. The method of manufacturing an optical element as defined in claim 1, further comprising:
   forming a second electrode on the second surface of the semiconductor wafer so that the second electrode is electrically connected to the conductive layer.

3. The method of manufacturing an optical element as defined in claim 1, further comprising:
   forming a second electrode on the first portion of the conductive layer.

4. The method of manufacturing an optical element as defined in claim 1, further comprising:
   forming a light-transmitting member on the first surface of the semiconductor wafer.

5. The method of manufacturing an optical element as defined in claim 1, further comprising:
   forming a light-transmitting member on the first surface of the semiconductor wafer after the forming of the conductive layer.

6. The method of the manufacturing an optical element as defined in claim 4, further comprising:
   dicing the semiconductor wafer and the light-transmitting member together into individual chips.

7. The method of the manufacturing an optical element defined in claim 1, further comprising:
forming an optical glass above the first surface of the semiconductor wafer.

8. The method of the manufacturing an optical element defined in claim 1, further comprising:
forming a color filter on the first surface of the semiconductor wafer.

9. The method of the manufacturing an optical element defined in claim 1, further comprising:
forming a microlens on the first surface of the semiconductor wafer.

10. A method of manufacturing an optical element, comprising:
forming a through hole in a semiconductor wafer so that the through hole extends from a first surface of the semiconductor wafer to a second surface of the semiconductor wafer, the second surface of the semiconductor wafer being opposite to the first surface of the semiconductor, the first surface of the semiconductor wafer having an optical section, a first electrode being formed on the first surface of the semiconductor wafer;
forming a conductive layer on an internal wall of the through hole so that the conductive layer is electrically connected to the first electrode; and
forming a hole in the first electrode before the forming of the through hole;
wherein the through hole is formed such that the through hole communicates with the hole in the first electrode during the forming of the thorough hole.

11. The method of manufacturing an optical element as defined in claim 10, further comprising:
forming a second electrode on the second surface of the semiconductor wafer so that the second electrode is electrically connected to the conductive layer.

12. The method of manufacturing an optical element as defined in claim 10, further comprising:
forming a light-transmitting member on the first surface of the semiconductor wafer.

13. The method of manufacturing an optical element as defined in claim 10, further comprising:
forming a light-transmitting member on the first surface of the semiconductor wafer after the forming of the conductive layer.

14. The method of the manufacturing an optical element as defined in claim 12, further comprising:
dicing the semiconductor wafer and the light-transmitting member together into individual chips.

15. The method of the manufacturing an optical element defined in claim 10, further comprising:
forming an optical glass above the first surface of the semiconductor wafer.

16. The method of the manufacturing an optical element defined in claim 10, further comprising:
forming a color filter on the first surface of the semiconductor wafer.

17. The method of the manufacturing an optical element defined in claim 10, further comprising:
forming a microlens on the first surface of the semiconductor wafer.

18. A method of manufacturing an optical element, comprising:
forming a through hole in a semiconductor wafer so that the through hole extends from a first surface of the semiconductor wafer to a second surface of the semiconductor wafer, the second surface of the semiconductor wafer being opposite to the first surface of the semiconductor, the first surface of the semiconductor wafer having an optical section, a first electrode being formed on the first surface of the semiconductor wafer; and
forming a conductive layer on an internal wall of the through hole so that the conductive layer is electrically connected to the first electrode;
wherein the forming of the through hole includes forming a pore in the semiconductor wafer by using a laser, and enlarging the pore by etching an inner wall of the pore such that the through hole is formed in the semiconductor wafer.

19. The method of manufacturing an optical element as defined in claim 18, further comprising:
forming a second electrode on the second surface of the semiconductor wafer so that the second electrode is electrically connected to the conductive layer.

20. The method of manufacturing an optical element as defined in claim 18, further comprising:
forming a light-transmitting member on the first surface of the semiconductor wafer.

21. The method of manufacturing an optical element as defined in claim 18, further comprising:
forming a light-transmitting member on the first surface of the semiconductor wafer after the forming of the conductive layer.

22. The method of the manufacturing an optical element as defined in claim 20, further comprising:
dicing the semiconductor wafer and the light-transmitting member together into individual chips.

23. The method of the manufacturing an optical element defined in claim 18, further comprising:
forming an optical glass above the first surface of the semiconductor wafer.

24. The method of the manufacturing an optical element defined in claim 18, further comprising:
forming a color filter on the first surface of the semiconductor wafer.

25. The method of the manufacturing an optical element defined in claim 18, further comprising:
forming a microlens on the first surface of the semiconductor wafer.

26. The method of the manufacturing an optical element defined in claim 18, wherein a wet etching is applied in the enlarging of the pore.

* * * * *